(12) United States Patent
Salehzadeh Einabad et al.

(10) Patent No.: US 12,724,199 B2
(45) Date of Patent: Sep. 1, 2026

(54) VERTICALLY TAPERED SPOT SIZE CONVERTER AND METHOD FOR FABRICATING THE SAME

(71) Applicant: NATIONAL RESEARCH COUNCIL OF CANADA, Ottawa (CA)

(72) Inventors: Omid Salehzadeh Einabad, Orleans (CA); Christina Elliott, Kanata (CA); Brian Rioux, Ottawa (CA); Nicaulas Sabourin, Orleans (CA); Martin Vachon, Gatineau (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 1027 days.

(21) Appl. No.: 17/757,176

(22) PCT Filed: Dec. 11, 2020

(86) PCT No.: PCT/CA2020/051710
§ 371 (c)(1),
(2) Date: Jun. 10, 2022

(87) PCT Pub. No.: WO2021/113984
PCT Pub. Date: Jun. 17, 2021

(65) Prior Publication Data

US 2023/0014644 A1 Jan. 19, 2023

Related U.S. Application Data

(60) Provisional application No. 62/947,857, filed on Dec. 13, 2019.

(51) Int. Cl.
*G02B 6/13* (2006.01)
*G02B 6/12* (2006.01)
(Continued)

(52) U.S. Cl.
CPC .......... *G02B 6/131* (2013.01); *G02B 6/1228* (2013.01); *G02B 6/136* (2013.01); *G03F 7/0005* (2013.01);
(Continued)

(58) Field of Classification Search
None
See application file for complete search history.

(56) References Cited

U.S. PATENT DOCUMENTS 6,229,947 B1 * 5/2001 Vawter ................ G02B 6/1228 385/132
2004/0037497 A1 * 2/2004 Lee ...................... G02B 6/132 385/28

(Continued)

FOREIGN PATENT DOCUMENTS

EP 1008012 B1 * 12/2004 .......... G02F 1/1335

OTHER PUBLICATIONS

Ullerich et al (Grey-tone Lithography and Dry Etching Technique for the fabrication of integrated spot size converters, Microelectronic Engineering, 46 (Year: 1999).*

(Continued)

*Primary Examiner* — Jonathan Johnson
*Assistant Examiner* — Andrew Preston Traywick
(74) *Attorney, Agent, or Firm* — ROBIC

(57) ABSTRACT

There is provided a method for fabricating a vertically tapered spot-size converter on a substrate, comprising: growing a waveguide core on the substrate; coating the waveguide core with a photoresist layer; placing a photomask having patterns at a negative focus offset point with respect to the photoresist layer, the patterns being defined by openings in the photomask, each opening having a cross-section comprising a region of constant width and at least one region of non-constant width, the non-constant width (Continued)

reducing in a direction extending away from the region of constant width; transferring the patterns of the photomask to the photoresist layer; providing the waveguide core with a vertically tapered profile, the vertically tapered profile being provided by the patterns of the photomask; growing a cladding layer over the waveguide core; and patterning and etching the cladding layer and the waveguide core, thereby defining the vertically tapered spot-size converter.

20 Claims, 5 Drawing Sheets

(51) Int. Cl.
*G02B 6/122* (2006.01)
*G02B 6/136* (2006.01)
*G03F 7/00* (2006.01)

(52) U.S. Cl.
CPC .............. *G02B 2006/12061* (2013.01); *G02B 2006/12078* (2013.01)

(56) References Cited

U.S. PATENT DOCUMENTS

2004/0063327 A1 4/2004 Chae et al.
2004/0120648 A1* 6/2004 Kwon .................. G02B 6/1228 385/43
2006/0204175 A1* 9/2006 Laurent-Lund ........ G02B 6/305 385/129
2009/0003399 A1* 1/2009 Taylor .................. G02B 6/1228 257/187
2010/0142900 A1 6/2010 Uchida et al.
2011/0310374 A1* 12/2011 Solak ...................... G03F 7/201 355/77
2016/0202611 A1* 7/2016 Kim .................. H01L 21/31144 430/296
2018/0364576 A1* 12/2018 Lee ........................... G03F 7/40

OTHER PUBLICATIONS

Ullerich et al (Grey-tone Lithography and Dry Etching Technique for the fabrication of integrated spot size converters, Microelectronic Engineering, 46 (1999)) (Year: 1999).*
International Search Report and Written Opinion dated Feb. 16, 2021 issued in corresponding international application No. PCT/CA2020/051710 by the Canadian Intellectual Property Office (7 pages).
Suzaki, Yasumasa, et al. Temperature- and Polarization-Insensitive Responsivity of a 1.3-μm Optical Transceiver Diode with an Integrated Spot-Size Converter, IEEE Journal of Quantum Electronics, 1998, vol. 34, No. 4, p. 686-690.
Ueda, Y., et al. Compact InP spot-size converter with vertically tapered core layer formed by micro-loading effect, Electronics Letters, 2017, vol. 53, No. 12, p. 797-799.
Ullerich, S., et al. Grey-tone lithography and dry etching technique for the fabrication of integrated spot size converters, Microelectronic Engineering, 1999, vol. 46, No. 1-4, p. 303-306.

* cited by examiner

VERTICALLY TAPERED SPOT SIZE CONVERTER AND METHOD FOR FABRICATING THE SAME

CROSS REFERENCE TO RELATED APPLICATIONS

This application is a filing under 35 U.S.C. § 371 of International Patent Application PCT/CA2020/051710, filed on Dec. 11, 2020, which claims priority to U.S. Provisional Application No. 62/947,857, filed on Dec. 13, 2019, each of which is incorporated by reference in its entirety.

TECHNICAL FIELD

The technical field generally relates to photonic devices and related systems, as well as methods for manufacturing the same. More particularly, the technical field relates to spot size converter and related systems, such as a vertically tapered spot size converter and method for fabricating the same.

BACKGROUND

Optical waveguides, such as on-chip photonic waveguide, are typically designed to support a single mode with a relatively small optical field in one direction (e.g., the vertical direction), while commercial optical fibres typically have a relatively circular mode field, the relatively circular mode field being larger that the relatively small optical field of the optical waveguides. This difference leads to a mode size mismatch between the optical waveguides and the commercial optical fibres. The mode size mismatch can notably result in an optical coupling loss between the optical fibres and optical waveguides or the photonic-integrated circuits (PIC) in which can be included the optical waveguides.

There is thus a need for techniques, methods, systems and devices that addresses or mitigate at least some of the challenges presented above.

SUMMARY

In accordance with one aspect, there is provided a method for fabricating a vertically tapered spot-size converter on a substrate, comprising:

- growing a waveguide core over the substrate;
- coating the waveguide core with a photoresist layer of positive photoresist;
- transferring patterns of a photomask to the photoresist, the patterns being defined by openings in the photomask, each opening having a cross-section comprising a region of constant width and at least one region of non-constant width, the non-constant width reducing in a direction extending away from the region of constant width, comprising:
  - aligning the photomask with a negative focus offset with respect to an external surface of the photoresist layer;
  - exposing the photoresist layer to electromagnetic radiation through the openings of the photomask, thereby forming exposed areas and unexposed areas in the photoresist layer;
  - developing the photoresist layer in a solvent to obtain uncovered regions of the waveguide core, the uncovered regions of the waveguide core being aligned with the exposed areas;

- thermally treating the unexposed areas of the photoresist layer;
  - etching the uncovered regions of the waveguide core to provide the waveguide core with a vertically tapered profile, the vertically tapered profile being provided by the patterns of the photomask; and
  - stripping off the exposed areas of the photoresist layer;
- growing a cladding layer extending over the waveguide core; and
- patterning and etching the cladding layer and the waveguide core to define the vertically tapered spot-size converter.

In some embodiments, said growing the waveguide core comprises growing a semiconductor layer over the substrate.

In some embodiments, the semiconductor layer is made of indium phosphide (InP) or gallium arsenide (GaAs).

In some embodiments, the substrate is made of silicon (Si).

In some embodiments, said growing the waveguide core carried out with an epitaxial growth method.

In some embodiments, the epitaxial growth method is metalorganic chemical vapour deposition (MOCVD).

In some embodiments, wherein coating the waveguide core with the photoresist layer of positive photoresist comprises spin-coating the photoresist layer of positive photoresist on the waveguide core.

In some embodiments, said at least one region of non-constant width comprises:

- a first region of non-constant width laterally projecting from a side of the region of constant width; and
- a second region of non-constant width laterally projecting from the first region of non-constant width.

In some embodiments, the first region of non-constant width has a first width linearly reducing in the direction extending away from the region of constant width.

In some embodiments, the second region of non-constant width has a second width exponentially reducing in the direction extending away from the region of constant width.

In some embodiments, said at least one region of non-constant width comprises:

- a third region of non-constant width laterally projecting from another side the region of constant width; and
- a fourth region of non-constant width laterally projecting from the third region of non-constant width.

In some embodiments, the third portion of non-constant width is a mirror-image of the first portion of non-constant width.

In some embodiments, the fourth portion of non-constant width is a mirror-image of the second portion of non-constant width.

In some embodiments, the negative focus offset ranges from about −8 μm to about −1 μm.

In some embodiments, exposing the photoresist layer to electromagnetic radiation comprises illuminating the photoresist layer with a beam having at least one ultraviolet spectral line.

In some embodiments, said at least one ultraviolet spectral line comprises 436 nm, 405 nm and 365 nm.

In some embodiments, thermally treating the unexposed areas of the photoresist layer comprises heating the same at about 120° C. for about 1 minute.

In some embodiments, the method further comprises a step of hardening the photoresist layer by illuminating the unexposed areas of the photoresist layer to deep ultraviolet radiation.

In some embodiments, said etching the uncovered regions is carried out in an inductively coupled plasma etch tool.

In some embodiments, said etching the uncovered regions is carried out using a chlorine ($Cl_2$) etching chemistry.

In some embodiments, said growing the waveguide core comprises growing one or more quantum wells.

In some embodiments, said growing the waveguide core comprises growing a bulk material.

In some embodiments, said growing a cladding layer extending over the waveguide core is a blanket growth.

In accordance with another aspect, there is provided a method for fabricating a vertically tapered spot-size converter on a substrate, comprising:

- growing a waveguide core on the substrate;
- coating the waveguide core with a photoresist layer;
- placing a photomask having patterns at a negative focus offset point with respect to the photoresist layer, the patterns being defined by openings in the photomask, each opening having a cross-section comprising a region of constant width and at least one region of non-constant width, the non-constant width reducing in a direction extending away from the region of constant width;
- transferring the patterns of the photomask to the photoresist layer;
- providing the waveguide core with a vertically tapered profile, the vertically tapered profile being provided by the patterns of the photomask;
- growing a cladding layer over the waveguide core; and
- patterning and etching the cladding layer and the waveguide core, thereby defining the vertically tapered spot-size converter.

In some implementations, there are provided techniques for reducing the coupling loss in photonic systems with a design of spot size converters (SSC) having a vertically tapered core monolithically integrated on a chip. The SSC is composed of a core region, a bottom layer and a top cladding. In the SSC, the core thickness reduces toward the facet region resulting in an expansion of the mode size in the vertical direction. In the facet region, the expanded mode will couple out of the chip into an external optical element, such as an optical fibre.

Other features will be better understood upon reading of embodiments thereof with reference to the appended drawings.

DETAILED DESCRIPTION

Figure 1:
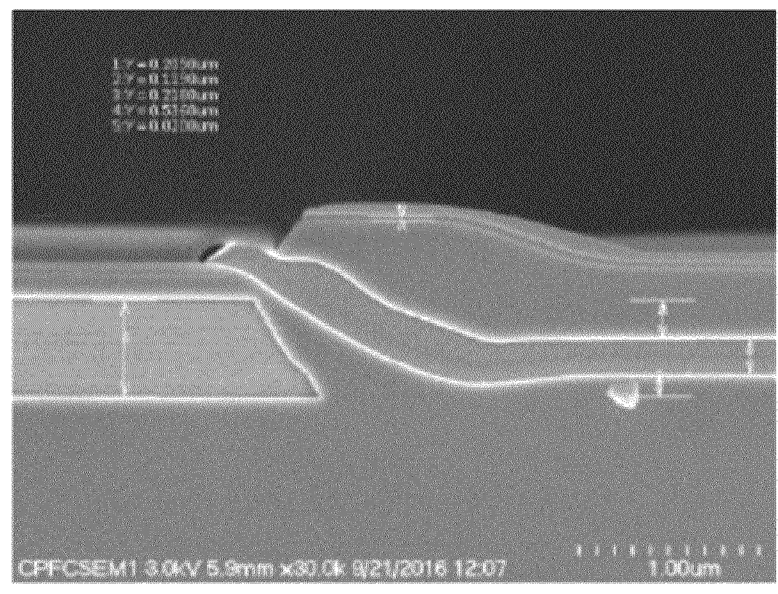
FIG. 1 (PRIOR ART) is an illustration of an SSC from prior art.

In the following description, similar features in the drawings have been given similar reference numerals. In order to not unduly encumber the figures, some elements may not be indicated on some figures if they were already mentioned in preceding figures. It should also be understood herein that the elements of the drawings are not necessarily drawn to scale and that the emphasis is instead being placed upon clearly illustrating the elements and structures of the present embodiments.

The terms "a", "an" and "one" are defined herein to mean "at least one", that is, these terms do not exclude a plural number of elements, unless stated otherwise. It should also be noted that terms such as "substantially", "generally" and "about", that modify a value, condition or characteristic of a feature of an exemplary embodiment, should be understood to mean that the value, condition or characteristic is defined within tolerances that are acceptable for the proper operation of this exemplary embodiment for its intended application.

In the present description, the terms "connected", "coupled", and variants and derivatives thereof, refer to any connection or coupling, either direct or indirect, between two or more elements. The connection or coupling between the elements may be mechanical, physical, optical, acoustical, operational, electrical, wireless, or a combination thereof.

In the present description, the terms "light" and "optical", and any variants and derivatives thereof, are intended to refer to electromagnetic radiation in any appropriate region of the electromagnetic spectrum and are not limited to visible light. For example, in one embodiment, the terms "light" and "optical" may encompass electromagnetic radiation in one or more regions of the electromagnetic spectrum, such as, for example and without being limitative, the millimeter, terahertz, visible and ultraviolet regions.

The following description will make use of the expression "negative focus offset" and/or the expression "positive focus offset". It is to be noted that both terms refer to a deviation from the optimal focal distance between an optical element and an object in the optical path of the optical element. In the context of the following description, a negative focus offset refers to a condition in which the distance between a photoresist layer and a photomask (sometimes referred to as "working distance") is greater than the optimal focal distance between the photoresist layer and the photomask. By opposition, a positive focus offset refers to a condition in which the distance between the photoresist layer and the photomask (i.e., the working distance) is smaller than the optimal focal distance.

It will be appreciated that positional descriptors indicating the position or orientation of one element with respect to another element are used herein for ease and clarity of description and should, unless otherwise indicated, be taken in the context of the figures and should not be considered limiting. It will be understood that spatially relative terms (e.g., "away", "vertical" and "horizontal", "top" and "bottom", "over", "under", "front" and "rear", "behind", "side" and the like) are intended to encompass different positions and orientations in use or operation of the present embodiments, in addition to the positions and orientations exemplified in the figures.

In the following description, the expression "quantum well" or "QW" generally refers to a heterostructure in which charged carriers of at least one type (i.e., electrons and/or holes) are confined in one direction (typically out-of-plane) and free in the other two directions (typically the in-plane directions). Quantum confinement is a quantum property that emerges when a particle is localized in a volume that has at least one reduced lateral dimension, e.g., a few nanometers. In this situation, the energy of the particle becomes quantized in this direction.

The expression “device” refers to a component or an assembly associated with a functionality. For example, an “photonic device” is a device that can accomplish a specific functionality involving the use or manipulation photons and/or charger carriers.

Techniques and methods for producing a vertical taper in a photoresist layer and transferring the vertical taper to an underneath layer through etching step(s) are provided. Various embodiments of these techniques and method will be described in greater detail after the following presentation of the following theoretical considerations.

General Theoretical Background

Spot size converters (SSCs) are photonic devices that allow to optically couple an optical element (e.g., a waveguide) with another optical element (e.g., an optical fiber), for example when the optical elements have different mode field sizes. Vertically tapered SSCs are a subclass of SSCs, and there exist at least three methods to fabricate such devices. The first method relies on etch and regrowth via selective area epitaxy [1]. The second method relies on etch micro-loading effect [2]. The third method relies on grey-scale lithography [3].

The first method includes epitaxially growing a base layer including an active or a passive core layer on an appropriate substrate, which can be provided on a wafer.

The wafer is patterned using a mask, and then the active or passive core layer is completely etched off in some regions including the device region wherein the SSC will be formed. Using the same mask, a selective area growth (SAG) is carried out using common growth techniques. An example of growth techniques is metalorganic chemical vapour deposition (MOCVD). The design of the mask and the associated loading effect on growth in the context of the SAG process leads to higher growth rate in the regions associated with a high mask loading and lower growth rate in regions associated with a lower mask loading. The result of this process is a vertically tapered core, wherein the core thickness decreases from the butt joint (i.e., regions associated with a higher mask loading) toward the facet (i.e., regions associated with a lower mask loading). An overclad layer is grown on the wafer either via a blanket deposition or an SAG process. Finally, a waveguide is formed via dry etching. The result of this method is illustrated in FIG. 1 (PRIOR ART). The first method is associated with at least two major challenges. Firstly, the process is long and complex, as it requires two epitaxial overgrowth steps. Secondly, there is a discontinuity between the SSC core grown via the SAG and the device core at the butt joint, resulting in reflection and loss. In addition, the process requires relatively strict control over the alignment of the SSC core and the device core at the butt joint. Failure to do so will result in excess loss.

Figure 2:
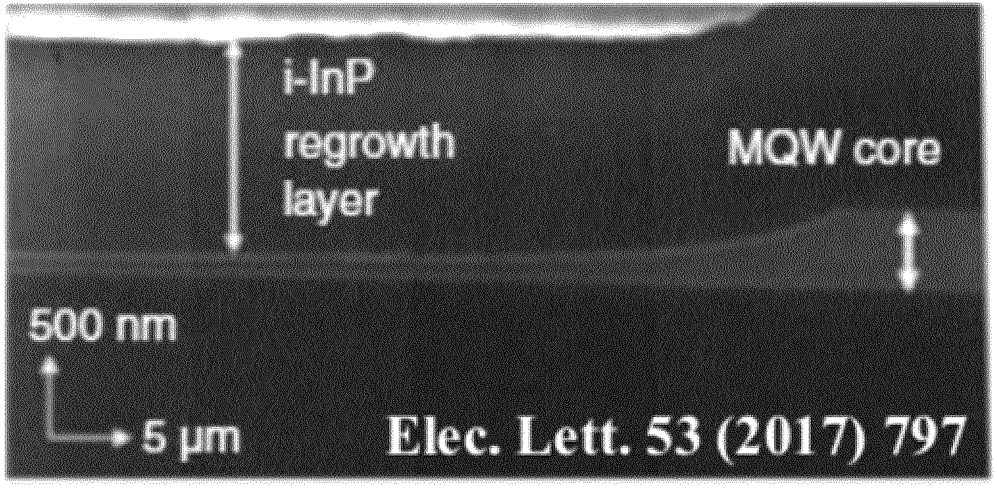
FIG. 2 (PRIOR ART) is an illustration of an SSC from prior art.

The second method includes epitaxially growing a base layer including the active or passive core layer on an appropriate substrate, which can be provided on a substrate. The wafer is covered with a dielectric mask and the wafer is patterned to produce tapered open apertures with tip width of approximately 2 μm expanding to approximately 20 μm toward the facet. After etching the hard mask (e.g., as SiOx) and removing the resist mask, the wafer is dry etched. It is believed that micro-loading effect on etch rate produces a vertical taper in the core. An overclad is subsequently grown on the wafer either via a blanket deposition or an SAG process. Finally, a waveguide is formed via a dry etch. The result of this method is illustrated in FIG. 2 (PRIOR ART). The main issue with the second method is that micro-loading effect on the etch rate is only significant at the dimensions close and below 2 μm. Therefore, the fabricated taper in the core along the SSC length should not exceed 15 μm. This short taper length is known to result in excess adiabatic mode size conversion loss.

The third method is a grey scale lithography technique used to create a continuous slope in the resist. Then, the resist profile is either transferred directly to a semiconductor layer via dry etching or first transferred to a dielectric mask and then into the semiconductor layer. One drawback associated with this method is that it requires a complex design of the photomask to be provided with high-resolution features to control the transmission of the light to the photoresist during the exposure. The complexity of the photomask design to achieve the desired profile in the photoresist using the third method remains a challenge.

Now turning to FIGS. 2 to 6, embodiments of a vertically tapered spot size converter and method for manufacturing the same will now be described.

Vertically Tapered Spot Size Converter

In accordance with a broad aspect, techniques and methods to produce a vertically tapered SSC are provided. It is to be noted that in the context of the current description, the expression “vertical” and derivatives thereof have to be understood as a direction being transversal to a plane of a waveguide. As such, the plane of the waveguide will be said to be “horizontal”. In the current disclosure, the plane of the waveguide is the direction along which the light propagates and will be referred to as the Z direction or the Z axis. The vertical direction of the tapered SSC extends along a direction that will be associated with a Y direction or a Y axis. The techniques and methods provided herein include a step of producing a vertically tapered profile in a photoresist layer and then transferring the vertically tapered profile to an underneath semiconductor layer via dry etching. In the various embodiments that will be herein described, the vertically tapered profile is transferred from the photoresist layer to the waveguide core (or active region) without using a dielectric mask or without relying to greyscale lithography. The details of these techniques and methods will now be described in greater detail.

Figure 6:
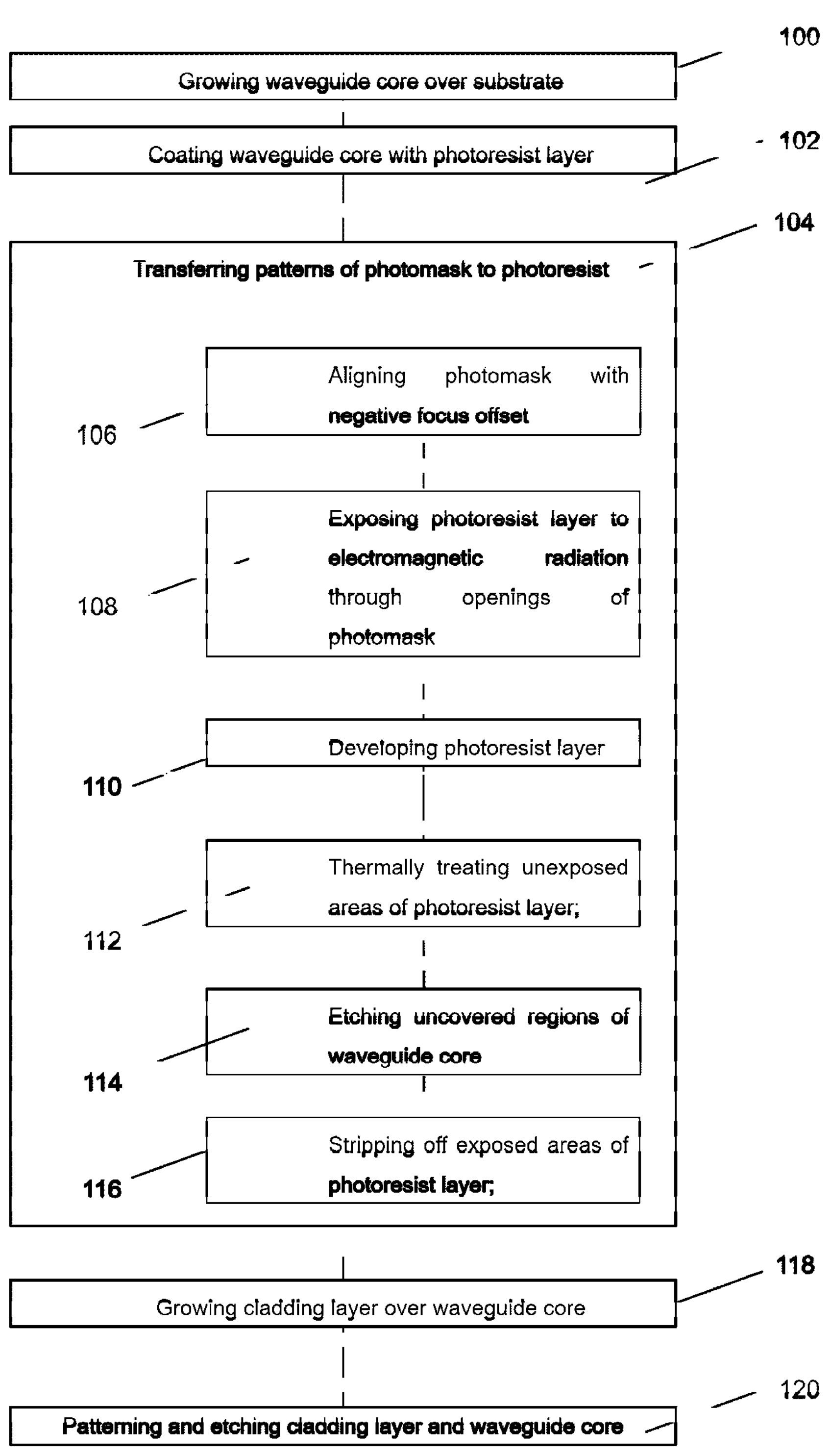
FIG. 6 is a flow chart illustrating steps of a method for fabricating a vertically tapered SSC on a substrate.

An embodiment of the method for fabricating a vertically tapered spot-size converter on a substrate is illustrated in FIG. 6. The method includes a step 100 of growing a waveguide core over the substrate. This step could be preceded by a step of providing the substrate. The step of growing the waveguide core can include a step of growing a semiconductor layer made of indium phosphide (InP) or gallium arsenide (GaAs) over the substrate. While a broad variety of substrates could be used, it is to be noted that the waveguide core can be grown, for example and without being limitative, on a substrate made of silicon (Si) or any other appropriate substrates. In some embodiments, the step of growing the waveguide core is carried out with an epitaxial growth method. An example of epitaxial growth method is metalorganic chemical vapour deposition (MOCVD).

Following the step of growing the waveguide core, the waveguide core is coated with a photoresist layer of positive photoresist in step 102. A characteristic of the positive photoresist is that the portion of the positive photoresist that is exposed to light (e.g., through a photomask during an “exposition step”) becomes soluble to a photoresist developer (i.e., during a “developing step”). Upon exposition to light through the photomask, the photo-sensitive material forming the positive photoresist will be degraded by light and the photoresist developer will dissolve the portions exposed to light, whereas the blocked or unexposed portions of the photoresist remain insoluble to the photoresist developer. After exposition and development of the positive photoresist, the patterns provided therein are thus a copy of the mask. The positive photoresist can be spin-coated on the waveguide core or could alternatively be coated or deposited with other deposition techniques. In a typically spin-coating step, a few milliliters of the positive photoresist are placed, poured or dispensed on the waveguide core. A rotational movement is then imparted to the waveguide core and a rotational speed equal to or greater than 1000 rpm can be reached. The centrifugal force due to the rotation of the waveguide core spreads the dispensed photoresist into a thin film of substantially uniform thickness and the excess is spun off the edge of the waveguide core. Part of the solvent contained in the photoresist can evaporate from the photoresist layer during the rotation of the waveguide core. In some embodiments, the photoresist layer can have a thickness ranging from approximately 2 μm to approximately 8 μm after the spin-coating step.

Once the waveguide core is coated with the photoresist layer of positive photoresist, the method includes a step 104 of transferring patterns of a photomask to the photoresist. The patterns are defined by transparencies, openings, holes or slots provided in the opaque portion(s) of the photomask. Each opening has a cross-section including a region of constant width and at least one contiguous region laterally projecting from the region of constant width. The contiguous region has a width reducing in a direction extending away from the region of constant width. In the context of the current description, the openings can either be empty (i.e., holes) or provided with a transparent material (i.e., windows).

Figure 3:
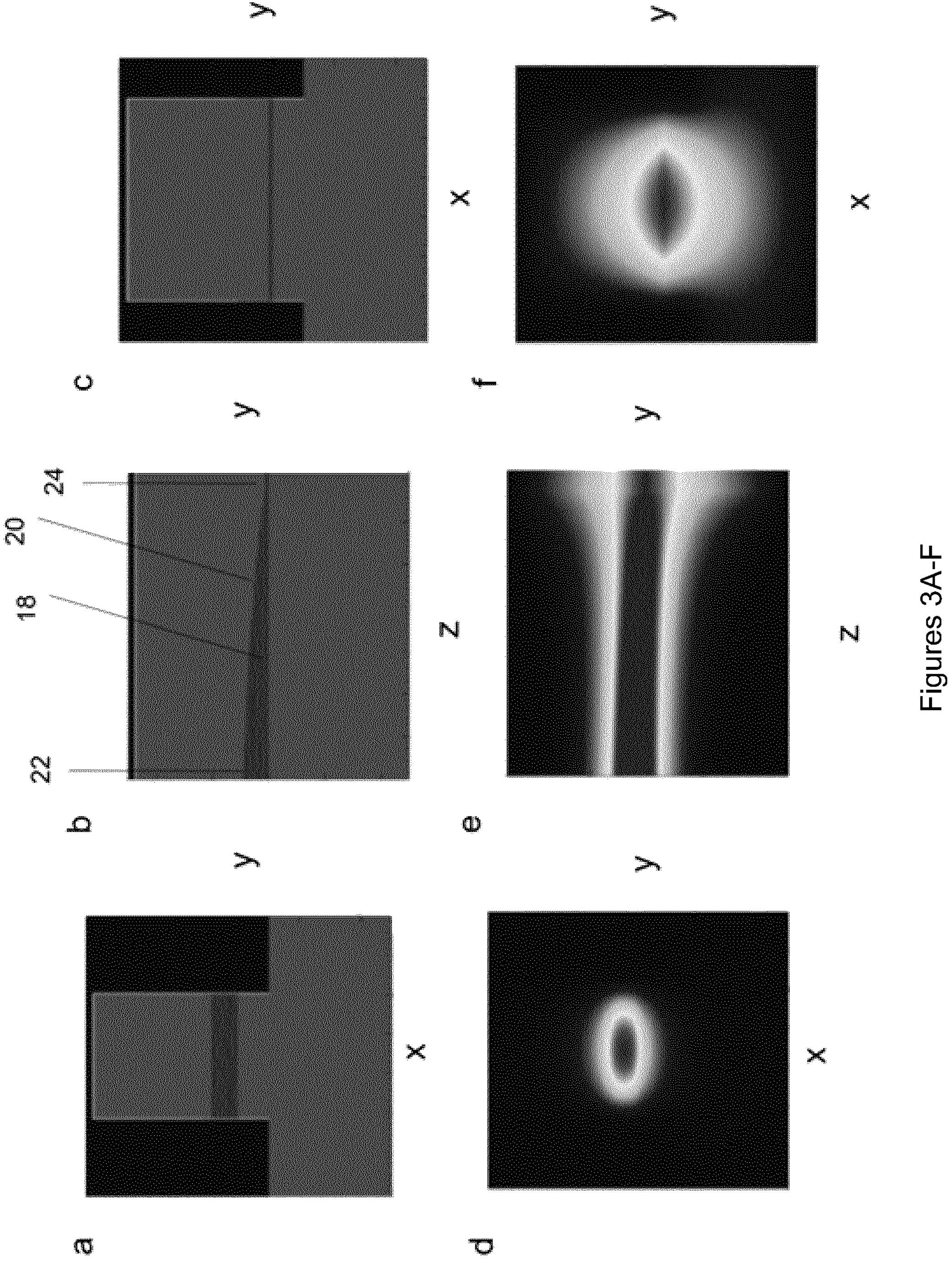
FIGS. 3A-F show a model of an SSC fabricated in accordance to one embodiment of a method for fabricating a vertically tapered SSC.
Figure 4:
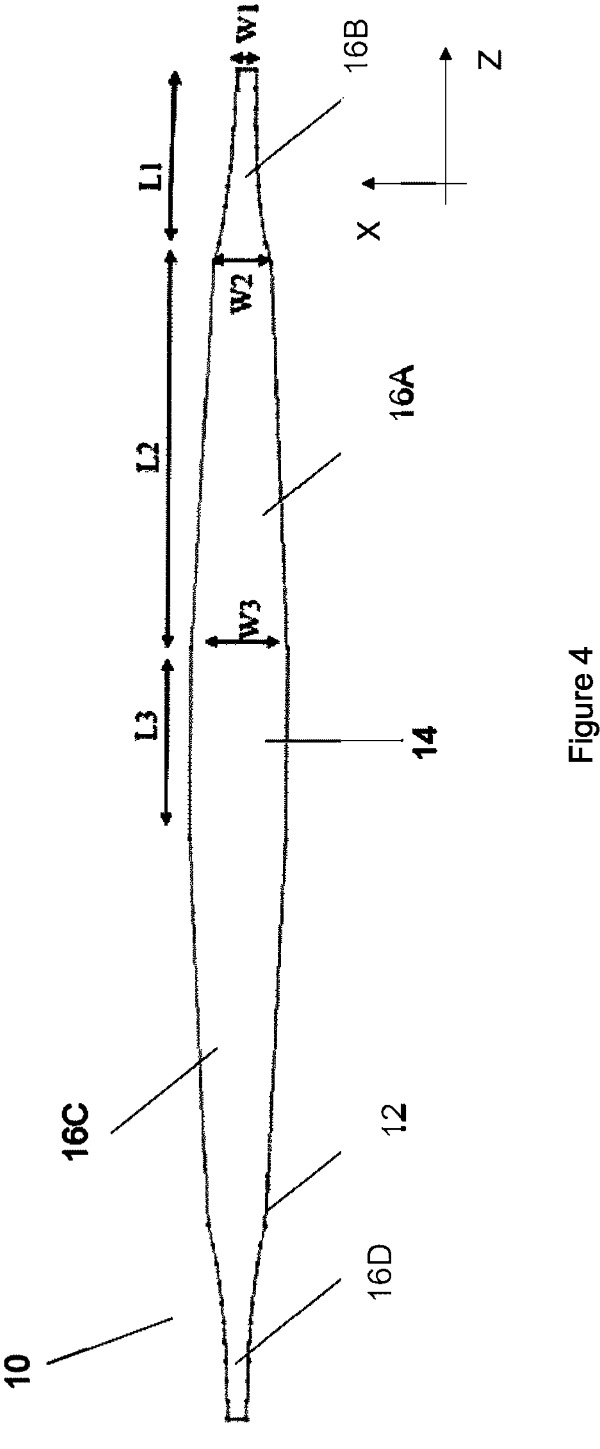
FIG. 4 is a top view of a photomask used in one embodiment of a method for fabricating a vertically tapered SSC.
Figure 5:
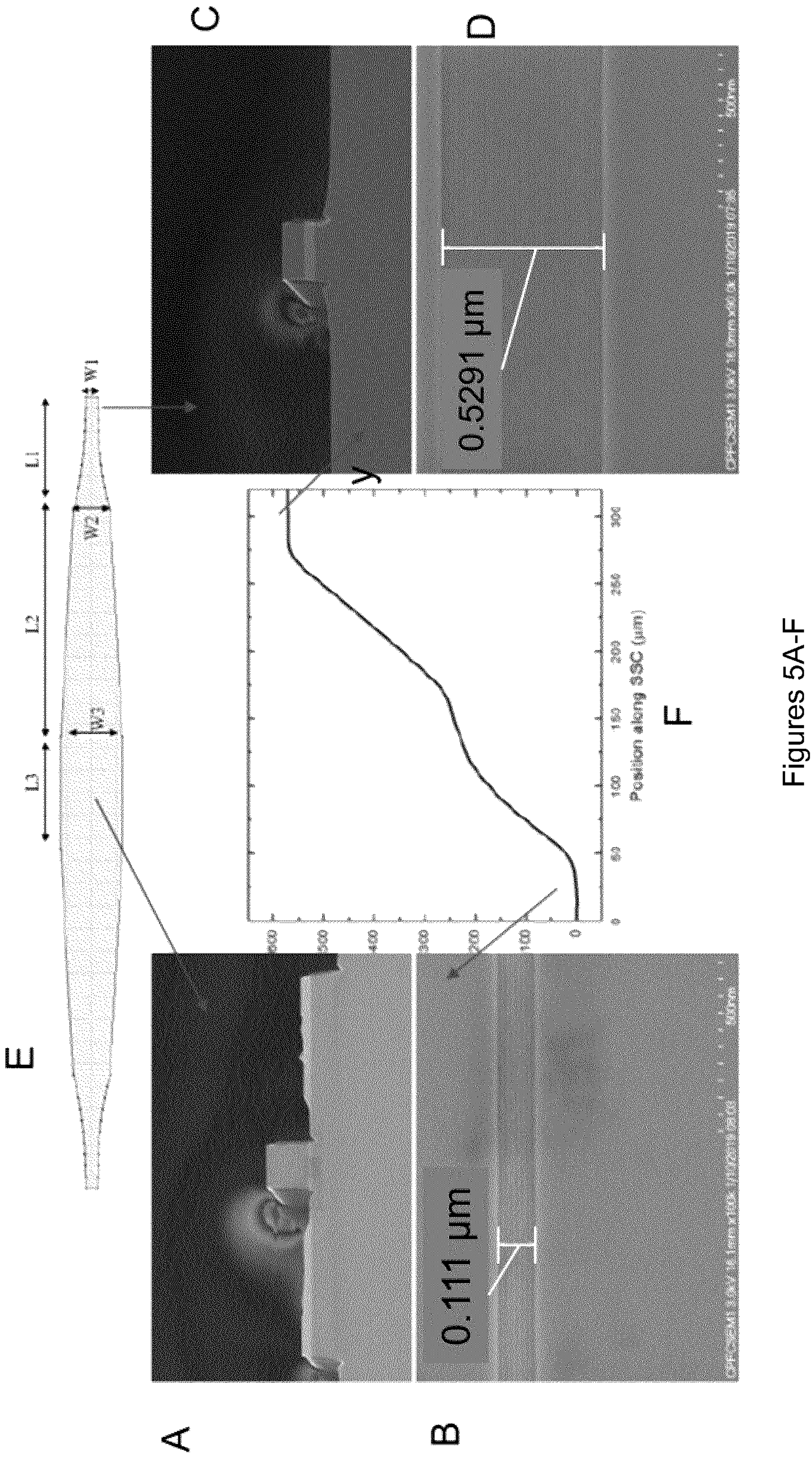
FIGS. 5A-F are scanning electron microscopy images and a profile of an SCC fabricated in accordance with one embodiment of a method for fabricating a vertically tapered SSC.

An embodiment of the opening 10 that can be provided in a photomask (not shown) is illustrated in FIG. 4. The opening 10 typically has a cross-section 12 having a region of constant width 14 and at least one region of non-constant width 16. In the depicted embodiment, the region of constant width 14 is a central region and the cross-section 12 includes four regions of non-constant width, labelled 16A-D. The dimensions of the region of constant width 14 are W3×L3 (width×length). In some embodiments, the width W3 ranges from approximately 6 μm to approximately 50 μm and the length L3 ranges from approximately 20 μm to approximately 200 μm. The first region 16A of non-constant width laterally projects from a respective side of the region of constant width 14. The dimensions of the first region of non-constant width 16A are W2×L2 (width×length). In some embodiments, the width W2 ranges from approximately 2 μm to approximately 6 μm and the length L2 ranges from approximately 10 μm to approximately 300 μm. In some embodiments, the segments defining the contour of the first region of non-constant width 16A has a linear slope, i.e., the first region of non-constant width 16A has a first width (i.e., W2) linearly reducing in the direction extending away from the region of constant width 14. The direction extending away from the region of constant way is aligned along the Z axis illustrated in FIG. 4. In such embodiments, the width W2 is said to be "linearly tapered". The second region of non-constant width 16B laterally projects from the first region of non-constant width 16A. The dimensions of the second region of non-constant width 16B are W1×L1 (width×length). In some embodiments, the width W1 ranges from approximately 1.5 μm to approximately 3.5 μm and the length L1 ranges from approximately 10 μm to approximately 300 μm. In some embodiments, the segments defining the contour of the opening in the second region of non-constant width 16B has a curve slope, i.e., the second region of non-constant width 16B has a second width (i.e., W1) exponentially reducing in the direction extending away from the region of constant width 14. In such embodiments, the width W1 is said to be "exponentially tapered". As illustrated in FIG. 3, the opening can be provided with a third region of non-constant width 16C and a fourth region of non-constant width 16D. The third region of non-constant width 16C can be a mirror-image of the first region of non-constant width 16A. The fourth region of non-constant width 16D can be a mirror-image of the second portion of non-constant width 16B. As illustrated, the third region of non-constant width 16C laterally projects from another side the region of constant width 14 (i.e., a different side than the first region of non-constant width 16A) and the fourth region of non-constant width 16D laterally projects from the third region of non-constant width 16C. The dimensions of the third region of non-constant width 16C are substantially the same as the ones of the first region of non-constant width 16A and the dimensions of the fourth region of non-constant width 16D are substantially the same as the ones of the second region of non-constant width 16B. When designed according to the embodiment described with reference to FIG. 4, the opening 10 is symmetrical about its transversal axis (along the X axis) and its longitudinal axis (along the Z axis). The opening generally 10 thus includes straight region(s) and at least one tapered region. The tapered region can be a single portion (not shown) or include multiple sections (as illustrated), wherein each section has a different taper design, i.e., a different width profile. In some embodiments, the region of constant width is the region that will be cleaved and where the optical fibre will be coupled when the SSC is used.

The step 104 of transferring the patterns of the photomask to the photoresist includes a step 106 of aligning the photomask with a negative focus offset with respect to an external surface of the photoresist layer. As it has been previously mentioned, the negative focus offset refers to the condition in which the distance between the photoresist layer and the photomask is greater than the optimal focal distance between the photoresist layer and the photomask. The negative focus offset ranges from approximately 1 μm to approximately 8 μm (in magnitude, meaning that the focus offset ranges from approximately −8 μm to approximately −1 μm).

Once the photomask is aligned with the photoresist layer, the photoresist layer is exposed to electromagnetic radiation through the openings of the photomask, in a step 108 thereby forming exposed areas and unexposed areas in the photoresist layer. As in most microfabrication process, the electromagnetic radiation is in the UV range. In some embodiments, exposing the photoresist layer to electromagnetic radiation comprises illuminating the photoresist layer with a beam having at least one ultraviolet spectral line. In some embodiments, the spectral line comprises 436 nm, 405 nm and 365 nm.

After the exposition of the photoresist layer, the photoresist layer is developed in a solvent to obtain uncovered regions of the waveguide core during step 110. The uncovered regions of the waveguide core are aligned with the exposed areas. The unexposed areas of the photoresist layer are then thermally treated in a step 112 in order to harden the same. The thermal treatment can be carried out at about 120° C. for about 1 minute. Other parameters could be used for the thermal treatment. In some embodiments, the unexposed areas of the photoresist layer can be hardened using deep ultra-violet (DUV) radiation.

Once the development of the photoresist is complete, a step 114 of etching the uncovered regions of the waveguide core is carried out. The step 114 of etching the uncovered regions allows providing the waveguide core with a vertically tapered profile. The vertically tapered profile is provided by the patterns of the photomask which have been previously presented. More specifically, the shape and design of the opening(s) in the photomask create zones having different photoresist profiles (due to a difference in exposure), the different photoresist profiles affecting the etching rates of the corresponding zones (and so the thickness of the waveguide core). As a result, some regions of the waveguide core will be etched at different rates one from another. In the embodiments being described in the current disclosure, the openings are designed such that the different photoresist profiles and etching rates will form the vertically tapered profile in the waveguide core. The vertically tapered profile 18 is illustrated in FIG. 2B. As illustrated, the thickness of the waveguide core 20 reduces from the device region 22 towards the facet region 24. One will note that in the context of the current description, the thickness is measured along the Y axis and is as such perpendicular to the light propagation direction (Z axis). In some embodiments, an inductively coupled plasma etch tool is used. Such a tool can be based on a $Cl_2$ chemistry. A nonlimitative embodiments of the result of this step is illustrated in FIGS. 3A-F, wherein the vertically tapered profile can be observed on a side view of the spot size converter (see FIG. 2B). FIG. 2A illustrates a front view of the device region and FIG. 2C shows a front view the facet region. FIGS. 2 D-F illustrate the optical mode profile in corresponding regions of the SSC illustrated in FIGS. 2A-C The method also includes a step 116 stripping off the exposed areas of the photoresist layer, thereby removing remaining portions of the photoresist layer.

The different steps presented above allow effectively changing the latent image gradient into a development rate gradient as a function of the image size dose variation, wherein the dose variation is proportional to the width of the openings provided in the photomask, such that, after developing the photoresist, the vertically tapered profile is obtained.

Once these steps are achieved, the method also includes a step 118 of growing a cladding layer extending over the waveguide core. The cladding layer has a smaller refractive index than the waveguide core. The cladding layer can be made of InP with $In_{(1-x)}Ga_xAs_yP_{(1-y)}$ used as the core material, or GaAs with the $Al_xGa_{(1-x)}As$ used as the waveguide core material.

It is followed by a step 120 of patterning and etching the cladding layer and the waveguide core to define the waveguide. A layer of oxide is then deposited on the cladding layer and the waveguide is patterned in the SSC region. At the facet region, the lateral dimension of the SSC is larger than the device region. The step of patterning the waveguide includes the standard microfabrication steps of lithography and etching.

Example of an Implementation

Now that several embodiments of techniques for fabricating a vertically tapered SSC have been presented, a nonlimitative exemplary implementation will now be presented.

A base layer including a waveguide core is epitaxially grown on a semiconductor substrate, which can be, for example and without being limitative, InP, GaAs or any other appropriate substrates.

The substrate is then coated with a photoresist having a thickness comprised between 2 μm to 8 μm. The coated substrate is exposed using a photomask with special designs. The designs include tapered regions and straight regions on the photomask. It is to be noted that the tapered regions can be a single section or multi sections where each section has a different tapered design or profile. The straight region generally contains the facet where the chip will be cleaved, and the optical fibre will be coupled. An example of such a profile is shown in FIG. 3C. The profile illustrated in FIG. 4 includes of three sections. The depicted embodiments illustrates a design with two tapered segments where the first segment is exponentially tapered with length in the range of 10 μm to 300 μm (L1) and the second segment is tapered linearly with length in the range of 10 μm to 300 μm (L2) and the third segment has a constant width. In FIG. 4, W1 is in the range of 1.5 μm to 3.5 μm, W2 in the range of 2.0 μm to 6.0 μm and W3 in the range of 6.0 μm to 50 μm.

During exposure, a selective negative focus offset in the range of −1 μm to −8 μm can be used. By effectively changing the latent image gradient into a development rate gradient as a function of the image size dose variation proportional to the width of the opening is achieved. After developing the photoresist, a vertically tapered profile is obtained which can be engineered according to the shape of the design feature on the photomask. After the development, the photoresist can be hardened via thermal treatment and deep ultraviolet radiation, for example using technique(s) already known in the art.

The patterned substrate is subsequently loaded in an inductively coupled plasma etch tool and is etched using a $Cl_2$-based etch chemistry. Therefore, the profile of the photoresist is transferred to the underneath semiconductor layer. An example of such a profile is shown in FIGS. 5A-F. The profile demonstrated in FIGS. 5A-F corresponds to the design example illustrated in FIG. 4. The results show that the linear and exponential segments of the design on the photomask results in a logarithmic and linear profile in the photoresist which is transferred to the semiconductor via dry etching.

After growing a cladding layer (sometimes referred to as "undoped overclad") made from, for example and without being limitative InP, the waveguide is patterned and etched. An example of the SEM cross-section image at the facet region form a finished device is shown in FIGS. 4B-E. In this example, the waveguide core is composed of a succession of quantum wells (sometimes referred to as "multi quantum wells"). Alternatively, the waveguide core could be a bulk material.

The SSCs resulting from the abovementioned process have been tested and showed an improvement of approximately 6 dB in insertion loss.

Several alternative embodiments and examples have been described and illustrated herein. The embodiments described above are intended to be exemplary only. A person skilled in the art would appreciate the features of the individual embodiments, and the possible combinations and variations of the components. A person skilled in the art would further appreciate that any of the embodiments could be provided in any combination with the other embodiments disclosed herein. The present examples and embodiments, therefore, are to be considered in all respects as illustrative and not restrictive. Accordingly, while specific embodiments have been illustrated and described, numerous modifications come to mind without significantly departing from the scope defined in the appended claims.

REFERENCES

1. J. Quantum Electron., 34 (1998) 686-690
2. Electronic Letters Vol. 53, No. 12 (2017) 797-799
3. Microelectronic Engineering 46 (1999) 303-306

The invention claimed is:

1. A method for fabricating a vertically tapered spot-size converter on a substrate, comprising:

growing a waveguide core over the substrate;

coating the waveguide core with a photoresist layer of positive photoresist;

transferring patterns of a photomask to the photoresist, the patterns being defined by openings in the photomask, each opening having a cross-section comprising a region of constant width and at least one region of non-constant width, the non-constant width reducing in a direction extending away from the region of constant width, comprising:

aligning the photomask with a negative focus offset with respect to an external surface of the photoresist layer;

exposing the photoresist layer to electromagnetic radiation through the openings of the photomask while maintaining the negative focus offset, thereby forming exposed areas and unexposed areas in the photoresist layer;

developing the photoresist layer in a solvent to obtain uncovered regions of the waveguide core, the uncovered regions of the waveguide core being aligned with the exposed areas;

thermally treating the unexposed areas of the photoresist layer;

etching the uncovered regions of the waveguide core to provide the waveguide core with a vertically tapered profile, the vertically tapered profile being provided by the patterns of the photomask; and stripping off the exposed areas of the photoresist layer;

growing a cladding layer extending over the waveguide core; and patterning and etching the cladding layer and the waveguide core to define the vertically tapered spot-size converter.

2. The method of claim 1, wherein said growing the waveguide core comprises growing a semiconductor layer over the substrate, the semiconductor layer being made of indium phosphide (InP) or gallium arsenide (GaAs).

3. The method of claim 1, wherein the substrate is made of silicon (Si).

4. The method of claim 1, wherein said growing the waveguide core carried out with an epitaxial growth method.

5. The method of claim 1, wherein coating the waveguide core with the photoresist layer of positive photoresist comprises spin-coating the photoresist layer of positive photoresist on the waveguide core.

6. The method of claim 1, wherein said at least one region of non-constant width comprises:

a first region of non-constant width laterally projecting from a side of the region of constant width; and a second region of non-constant width laterally projecting from the first region of non-constant width.

7. The method of claim 6, wherein the first region of non-constant width has a first width linearly reducing in the direction extending away from the region of constant width.

8. The method of claim 6, wherein the second region of non-constant width has a second width exponentially reducing in the direction extending away from the region of constant width.

9. The method of claim 6, wherein said at least one region of non-constant width comprises:

a third region of non-constant width laterally projecting from another side the region of constant width; and a fourth region of non-constant width laterally projecting from the third region of non-constant width.

10. The method of claim 9, wherein the third portion of non-constant width is a mirror-image of the first portion of non-constant width.

11. The method of claim 9, wherein the fourth portion of non-constant width is a mirror-image of the second portion of non-constant width.

12. The method of claim 1, wherein the negative focus offset ranges from about −8 μm to about −1 μm.

13. The method of claim 1, wherein exposing the photoresist layer to electromagnetic radiation comprises illuminating the photoresist layer with a beam having at least one ultraviolet spectral line, said at least one ultraviolet spectral line comprises 436 nm, 405 nm and 365 nm.

14. The method of claim 1, wherein thermally treating the unexposed areas of the photoresist layer comprises heating the same at about 120° C. for about 1 minute.

15. The method of claim 1, further comprising a step of hardening the photoresist layer by illuminating the unexposed areas of the photoresist layer to deep ultraviolet radiation.

16. The method of claim 1, wherein said etching the uncovered regions is carried out in an inductively coupled plasma etch tool.

17. The method of claim 1, wherein said etching the uncovered regions is carried out using a chlorine ($Cl_2$) etching chemistry.

18. The method of claim 1, wherein said growing the waveguide core comprises: growing one or more quantum wells or growing a bulk material.

19. The method of claim 1, wherein said growing a cladding layer extending over the waveguide core is a blanket growth.

20. A method for fabricating a vertically tapered spot-size converter on a substrate, comprising:

growing a waveguide core on the substrate;

coating the waveguide core with a photoresist layer;

placing a photomask having patterns at a negative focus offset point with respect to the photoresist layer, the patterns being defined by openings in the photomask, each opening having a cross-section comprising a region of constant width and at least one region of non-constant width, the non-constant width reducing in a direction extending away from the region of constant width;

transferring the patterns of the photomask to the photoresist layer while maintaining the photomask at the negative focus offset point;

providing the waveguide core with a vertically tapered profile, the vertically tapered profile being provided by the patterns of the photomask;

growing a cladding layer over the waveguide core; and patterning and etching the cladding layer and the waveguide core, thereby defining the vertically tapered spot-size converter.

* * * * *